United States Patent
Kim

(10) Patent No.: US 9,142,536 B2
(45) Date of Patent: Sep. 22, 2015

(54) SEMICONDUCTOR DEVICE AND METHOD FOR FABRICATING THE SAME

(71) Applicant: Samsung Electronics Co., Ltd., Suwon-Si, Gyeonggi-Do (KR)

(72) Inventor: Yoon-Jae Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 30 days.

(21) Appl. No.: 13/960,269

(22) Filed: Aug. 6, 2013

(65) Prior Publication Data

US 2014/0134837 A1    May 15, 2014

(30) Foreign Application Priority Data

Nov. 13, 2012 (KR) .................. 10-2012-0128232

(51) Int. Cl.
  *H01L 21/44* (2006.01)
  *H01L 27/02* (2006.01)
  *H01L 27/108* (2006.01)

(52) U.S. Cl.
  CPC ...... *H01L 27/0207* (2013.01); *H01L 27/10885* (2013.01); *H01L 27/10888* (2013.01)

(58) Field of Classification Search
  None
  See application file for complete search history.

(56) References Cited

U.S. PATENT DOCUMENTS

| | | |
|---|---|---|
| 6,492,275 B2 | 12/2002 | Riley et al. |
| 7,709,375 B2 | 5/2010 | Bae |
| 7,763,542 B2 | 7/2010 | Kim et al. |
| 7,972,956 B2 | 7/2011 | Kang et al. |
| 7,998,870 B2 | 8/2011 | Nam |
| 2011/0169174 A1 | 7/2011 | Kim |

FOREIGN PATENT DOCUMENTS

| | | |
|---|---|---|
| KR | 20010077260 A | 8/2001 |
| KR | 20050014236 A | 2/2005 |
| KR | 20090074470 A | 7/2009 |
| KR | 10-1019712 B1 | 3/2011 |
| KR | 10-1128919 B1 | 3/2012 |

OTHER PUBLICATIONS

Manchine translation of KR1020100087879 provided in the IDS, by Kim, 2012.*

* cited by examiner

*Primary Examiner* — Yasser A Abdelaziez

(74) *Attorney, Agent, or Firm* — Harness, Dickey & Pierce, P.L.C.

(57) ABSTRACT

A method for manufacturing the semiconductor device may include forming a capping layer including a bit line contact hole on a substrate, forming a spacer on inner walls of the bit line contact hole, forming a bit line contact in the bit line contact hole, forming a bit line layer on the substrate, exposing the spacer by etching the bit line layer, and etching the spacer.

11 Claims, 16 Drawing Sheets

SEMICONDUCTOR DEVICE AND METHOD FOR FABRICATING THE SAME

CROSS-REFERENCE TO RELATED APPLICATION

This application claims priority from Korean Patent Application No. 10-2012-0128232 filed on Nov. 13, 2013 in the Korean Intellectual Property Office, and all the benefits accruing therefrom under 35 U.S.C. 119, the contents of which in its entirety are herein incorporated by reference.

BACKGROUND

1. Field

Example embodiments of the inventive concepts relate to a semiconductor device and a method for fabricating the same.

2. Description of the Related Art

In a dynamic random access memory (DRAM) device having a unit cell consisting of a MOS transistor and a capacitor, decreasing a chip area occupied by a capacitor while increasing capacitance of the capacitor is an important factor to achieve high integration of the DRAM device.

In order to form a capacitor having high capacitance in a narrow area, increasing the height of the capacitor or decreasing the thickness of a dielectric layer is being attempted.

However, in the former case, a problem may arise due to an increase in the step difference by increasing the height of the capacitor. In the latter case, leakage current may increase by decreasing the thickness of a dielectric layer.

To overcome the problems, there has recently been proposed a method for reducing the capacitance of the capacitor required to maintain the capability of a sense amplifier at the same level by reducing bit line parasitic capacitance in half using a buried type gate structure.

However, according to the tendency toward high integration, a margin between a storage node contact and a bit line contact may be unavoidably reduced.

SUMMARY

Example embodiments of the inventive concepts provide a semiconductor device and a method for fabricating the same, which has improved product reliability by securing a margin between a storage node contact and a bit line contact.

The inventive concepts will be described in or be apparent from the following description of example embodiments.

According to example embodiments of the inventive concepts, a method for fabricating a semiconductor device may include forming a capping layer including a bit line contact hole on a substrate, forming a spacer on inner walls of the bit line contact hole, forming a bit line contact in the bit line contact hole, forming a bit line layer on the substrate, exposing the spacer by etching the bit line layer, and etching the spacer.

According to example embodiments of the inventive concepts, a semiconductor device may include a substrate including first and second active regions, a bit line contact on the first active region, a bit line on the bit line contact, and a spacer on opposite side surfaces of the bit line contact, the spacer having a top surface lower than a top surface of the substrate.

According to example embodiments of the inventive concepts, a method for fabricating a semiconductor device may include forming a spacer along at least a portion of a contact hole in a substrate structure, forming a conductive layer in the contact hole and on the substrate structure, exposing the spacer by etching the conductive layer, and selectively etching the spacer having a different etching selectivity from the substrate structure and the conductive layer.

BRIEF DESCRIPTION OF THE DRAWINGS

The above and other features and advantages of the inventive concepts will become more apparent by describing in detail example embodiments thereof with reference to the attached drawings in which.

DETAILED DESCRIPTION

Figure 1:
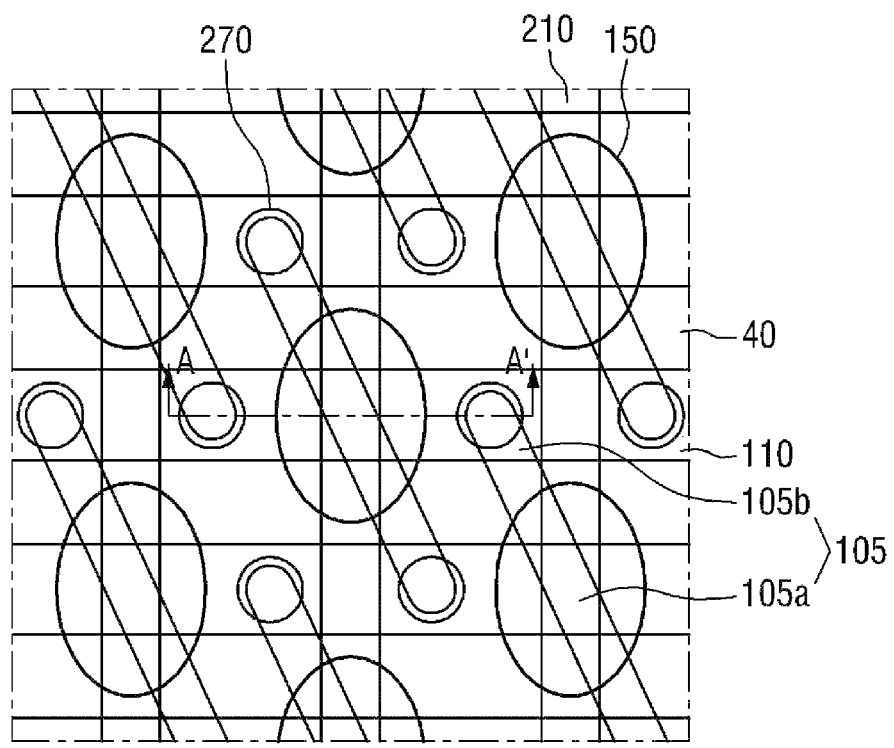
FIG. 1 is a layout view for explaining a semiconductor device according to example embodiments of the inventive concepts.

The inventive concepts will now be described more fully hereinafter with reference to the accompanying drawings, in which example embodiments of the inventive concepts are shown. This inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art. The same reference numbers indicate the same components throughout the specification. In the attached figures, the thickness of layers and regions is exaggerated for clarity.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The use of the terms "a" and "an" and "the" and similar referents in the context of describing the inventive concepts (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the inventive concepts.

Unless defined otherwise, all technical and scientific terms used herein have the same meaning as commonly understood by one of ordinary skill in the art to which the inventive concepts belong. It is noted that the use of any and all examples, or example terms provided herein is intended merely to better illuminate the inventive concepts and is not a limitation on the scope of the inventive concepts unless otherwise specified. Further, unless defined otherwise, all terms defined in generally used dictionaries may not be overly interpreted.

Hereinafter, a semiconductor device according to example embodiments of the inventive concepts will be described with reference to FIG. 1. FIG. 1 is a layout view for explaining a semiconductor device according to example embodiments of the inventive concepts.

Figure 3:
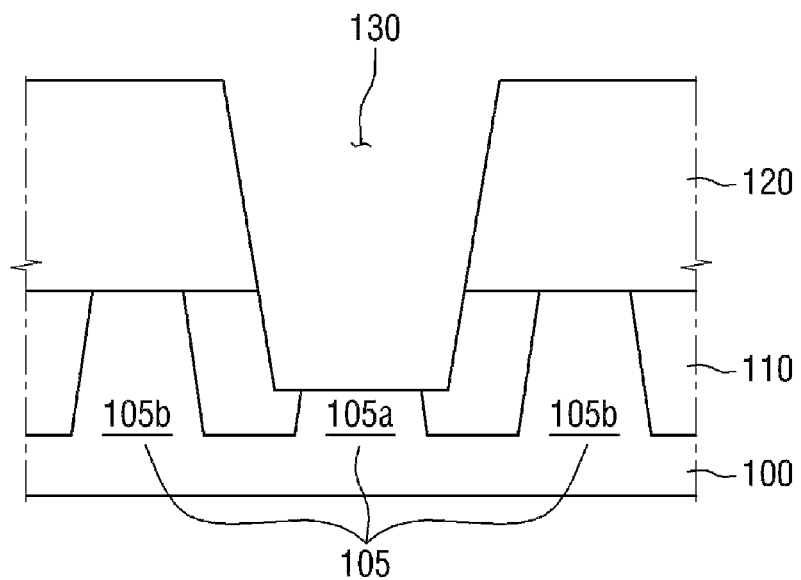
FIGS. 3 to 12 are cross-sectional views taken along the line A-A' of FIG. 1, illustrating intermediate process steps of the method for fabricating a semiconductor device according to example embodiments of the inventive concepts.

Referring to FIG. 1, in the semiconductor device according to example embodiments of the inventive concepts, an active region 105 may be formed in a substrate 100 (see FIG. 3). A gate line 40 may be formed to cross the active region 105. In addition, a bit line 210 may be formed on the substrate 100, and a storage electrode (not shown) may be formed on the active region 105.

The active region 105 may be defined by forming an isolation layer 110 in the substrate 100. In a $6F^2$ layout, for example, the active region 105 may be formed to be tilted at a predetermined or given angle, in a vertical or horizontal direction, but example embodiments of the inventive concepts are not limited thereto.

In addition, two gate lines 40 may be formed to cross one active region 105. In such a manner, two transistors may be formed on the active region 105. In detail, two transistors include two gate lines 40 formed to cross one active region 105, a first active region 105a in the active region 105 between the two gate lines 40, and a second active region 105b formed opposite sides of the first active region 105a for the two gate lines 40. In other words, the two transistors share the first active region 105a while not sharing the second active region 105b.

The active region 105 may include source/drain regions. For example, the first active region 105a may be a drain region, and the second active region 105b may be a source region, but example embodiments of the inventive concepts are not limited thereto.

In example embodiments, the first active region 105a may be directly connected to the bit line 210 through a bit line contact 150 formed on the first active region 105a, and the second active region 105b may be connected to the storage electrode (not shown) through a storage node contact 270 formed on the second active region 105b.

The transistor according to example embodiments of the inventive concepts may be a transistor having a recess channel. The gate line 40 may be formed in the substrate 100 to be relatively narrow and deep.

Figure 2:
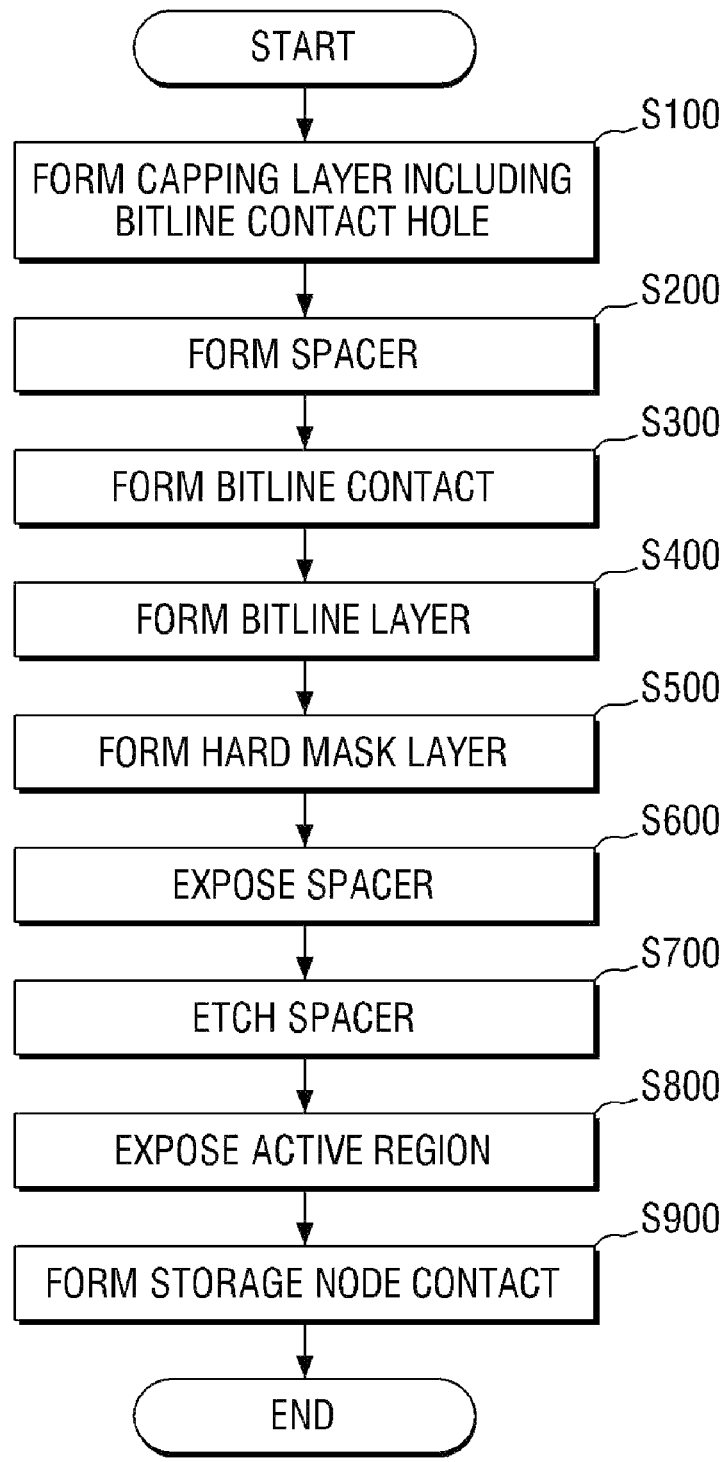
FIG. 2 is a flowchart of a method for fabricating a semiconductor device according to example embodiments of the inventive concepts.

A method for fabricating a semiconductor device according to example embodiments of the inventive concepts will be described with reference to FIGS. 2 to 12. FIG. 2 is a flowchart of a method for fabricating a semiconductor device according to example embodiments of the inventive concepts, and FIGS. 3 to 12 are cross-sectional views taken along the line A-A' of FIG. 2, illustrating intermediate process steps of the method for fabricating a semiconductor device according to example embodiments of the inventive concepts.

Referring to FIGS. 2 and 3, a capping layer 120 including a bit line contact hole 130 may be formed on the substrate 100 (S100). The substrate 100 is prepared. The substrate 100 may include a rigid substrate, e.g., a silicon substrate, a silicon on insulator (SOI) substrate, a gallium arsenide substrate, a silicon germanium, a ceramic substrate, a quartz substrate or a glass substrate for display, or a flexible plastic substrate made of polyimide, polyester, polycarbonate, polyethersulfone, polymethylmethacrylate, polyethylene naphthalate, or polyethyleneterephthalate.

The isolation layer 110 and the active region 105 may be formed in the substrate 100. The active region 105 may be defined by the isolation layer 110 having, for example, a shallow trench isolation (STI) structure, and may be divided into the first active region 105a and the second active region 105b.

Although not shown in FIG. 3, as described above, a recess gate may further be formed in the substrate 100.

The capping layer 120 may be formed on the substrate 100. The capping layer 120 may be an insulation layer or a polysilicon layer. When the capping layer 120 is an insulation layer, the capping layer 120 may include a nitride, but example embodiments of the inventive concepts are not limited thereto.

While the capping layer 120 having a single layer is exemplified in FIG. 3, the capping layer 120 may include a plurality of layers. In other words, in some example embodiments of the inventive concepts, unlike in FIG. 3, a multi-layered capping layer (not shown), including a first capping layer (not shown) that is an underlying layer, and a second capping layer (not shown) that is an overlying layer, may be formed on the substrate 100.

After forming the capping layer 120 on the substrate 100, the bit line contact hole 130 may be formed. The first active region 105a on the substrate 100 may be exposed by forming the bit line contact hole 130. When forming the bit line contact hole 130, as shown in FIG. 3, a portion of a top surface of the substrate 100 may be etched, but example embodiments of the inventive concepts are not limited thereto. Alternatively, in some example embodiments of the inventive concepts, when the bit line contact hole 130 is formed on the capping layer 120 formed on the substrate 100, the top surface of the substrate 100 may not be etched. In addition, the top surface of the substrate 100 may not be etched and a portion of the capping layer 120 may remain on the substrate 100.

The bit line contact hole 130 may be formed by, for example, a photolithography process, but example embodiments of the inventive concepts are not limited thereto.

Figure 4:
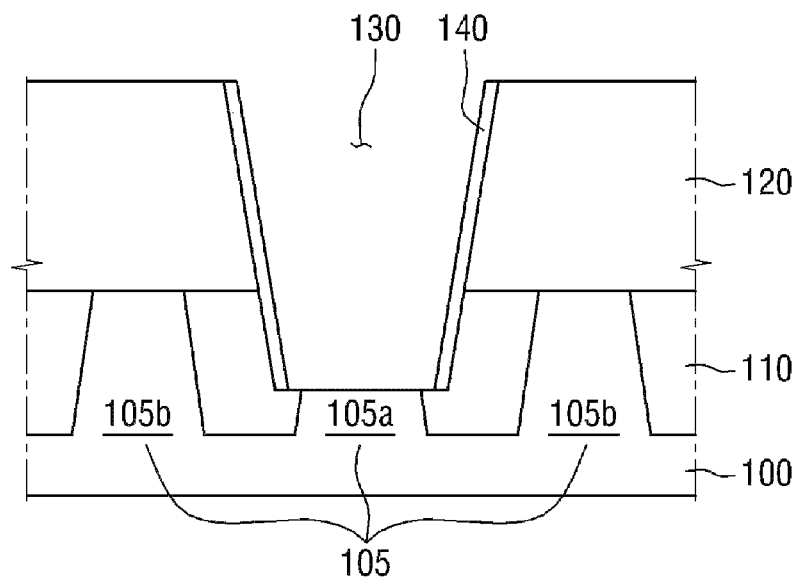

Referring to FIGS. 2 and 4, a spacer 140 may be formed in the bit line contact hole 130 (S200). Forming the spacer 140 in the bit line contact hole 130 may be performed in various manners. For example, the spacer 140 may be conformally formed along the capping layer 120, sidewalls of the bit line contact hole 130 and a top surface of the first active region 105a. The spacer 140 conformally formed along the top surface of the first active region 105a may be etched such that the spacer 140 remains only on the sidewalls of the bit line contact hole 130, thereby forming the spacer 140 shown in FIG. 4. However, the inventive concepts do not limit the method for forming the spacer 140 to that illustrated herein. Other methods for forming the spacer 140 can be easily inferred by one skilled in the art, and detailed descriptions thereof will be omitted.

In example embodiments, a material for forming the spacer 140 may be different from materials for forming the substrate 100, the capping layer 120, a bit line contact (not shown), a bit line (not shown) or a hard mask (not shown).

In example embodiments of the inventive concepts, for example, the spacer 140 may be made of a first material, and the substrate 100, the capping layer 120, the bit line contact (not shown), the bit line (not shown) and the hard mask (not shown) may be formed of a second material different from the first material. In detail, the spacer 140 may be formed of, for example, an oxide, and the substrate 100, the capping layer 120, the bit line contact (not shown), the bit line (not shown) and the hard mask (not shown) may be made of a material other than the oxide.

As described above, when only the spacer 140 is formed of a different material from the substrate 100, the capping layer 120, the bit line contact (not shown), the bit line (not shown) and the hard mask (not shown), etching selectivity to the spacer 140 may become higher in a subsequent etching process of the spacer 140. In other words, only spacer 140 may be selectively etched without etching the substrate 100, the capping layer 120, the bit line contact (not shown), the bit line (not shown) and the hard mask (not shown), which will later be described in more detail.

Figure 5:
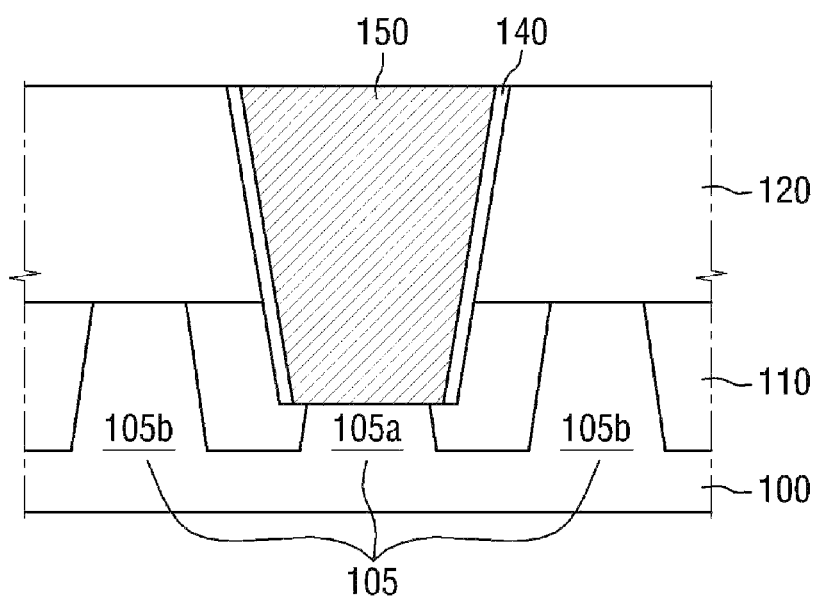

Referring to FIGS. 2 and 5, the bit line contact 150 may be formed in the bit line contact hole 130 (S300). The bit line contact 150 functions to connect the first active region 105a to the bit line. The bit line contact 150 may be made of a conductive material, for example, polysilicon. If the conductive material is polysilicon, the bit line contact 150 and the capping layer 120 may include the same material, but example embodiments of the inventive concepts are not limited thereto.

Alternatively, the capping layer 120 and the bit line contact 150 may include different materials.

When the bit line contact 150 and the capping layer 120 include the same material, they may be etched together while exposing the active region 105 in a later step, which will later be described in more detail.

When forming the bit line contact 150, a conductive material may be stacked outside the bit line contact hole 130. However, the stacked conductive material may be removed by, for example, a chemical mechanical polishing (CMP) process.

Figure 6:
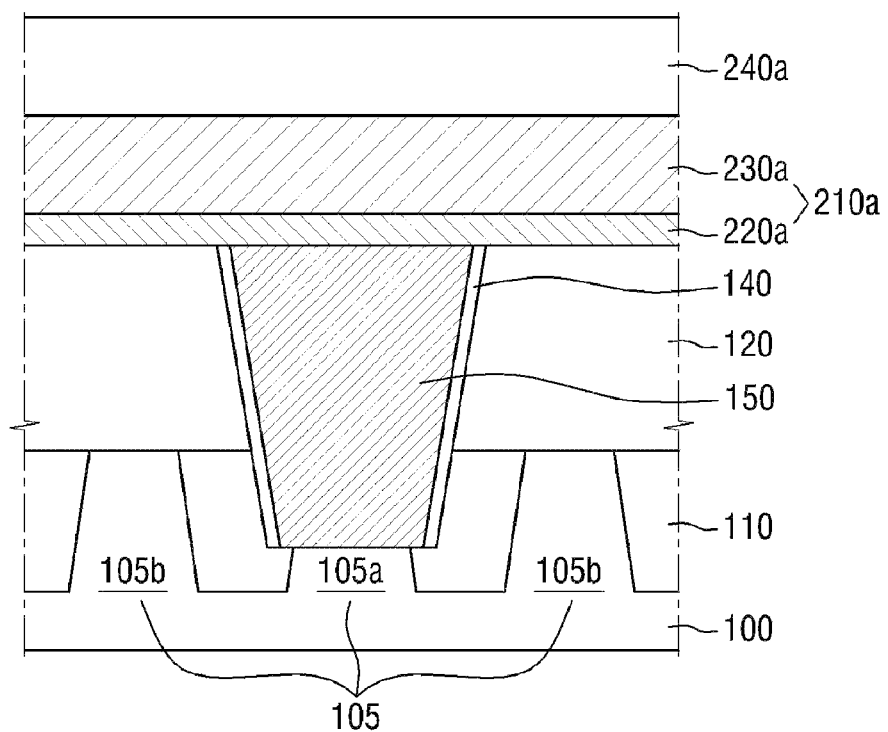

Referring to FIGS. 2 and 6, a bit line layer 210a may be formed on the capping layer 120, the spacer 140 and the bit line contact 150 (S400). The bit line layer 210a may include a barrier metal layer 220a and a bit line forming conductive layer 230a. In detail, the barrier metal layer 220a is stacked, and the bit line forming conductive layer 230a is then stacked on the barrier metal layer 220a, thereby forming the bit line layer 210a. The barrier metal layer 220a may include, for example, Ti, or TiN, and the bit line forming conductive layer 230a may include, for example, W, but example embodiments of the inventive concepts are not limited thereto. The bit line layer 210a is to be patterned later, and the bit line layer 210a on the patterned first active region 105a may become the bit line 210.

A hard mask layer 240a may be additionally formed on the bit line layer 210a (S500). The hard mask layer 240a may be patterned to become a hard mask 240 (see FIG. 7). The hard mask 240 formed by patterning the hard mask layer 240a may be required in a subsequent process for exposing the second active region 105b, which will later be described. The hard mask layer 240a may be, for example, a nitride layer, but example embodiments of the inventive concepts are not limited thereto. The bit line layer 210a and the hard mask layer 240a may be formed in-situ.

Figure 7:
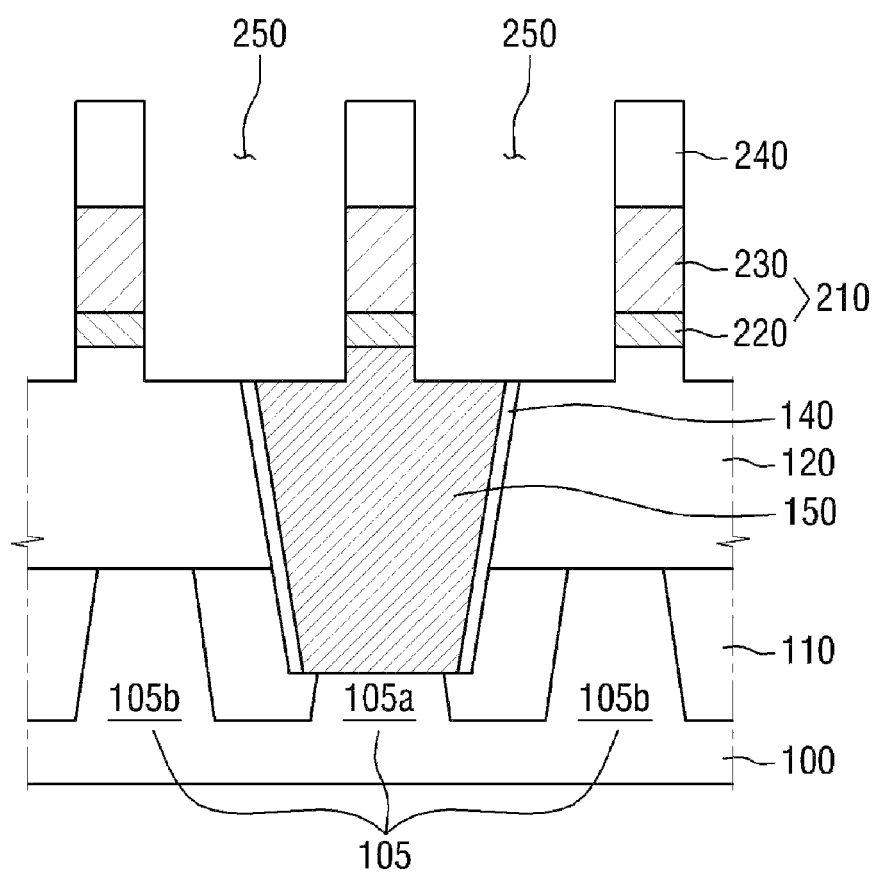

Referring to FIGS. 2 and 7, the spacer 140 may be exposed by etching the bit line layer 210a (S600) to form a bit line contact hole 250. In order to expose the spacer 140, the bit line layer 210a and the hard mask layer 240a may be patterned. In detail, the hard mask layer 240a is covered by a mask pattern (not shown), and the hard mask layer 240a and the bit line layer 210a may be sequentially subject to a first etching process, thereby exposing the spacer 140. In the course of exposing the spacer 140, the bit line layer 210a may become the bit line 210 including the barrier metal pattern 220 and the bit line forming conductive pattern 230, and the hard mask layer 240a may become the hard mask 240.

During the first etching process, the bit line contact 150, the spacer 140 and the capping layer 120 may be partially etched. Thus, the capping layer 120 having the bit line 210 and the top surface of the bit line contact 150 may be positioned higher than surfaces of the capping layer 120 and the bit line contact 150 exposed by the first etching process, but example embodiments of the inventive concepts are not limited thereto. During the etching, portions of the bit line contact 150, the spacer 140 and the capping layer 120 may not be etched.

Figure 8:
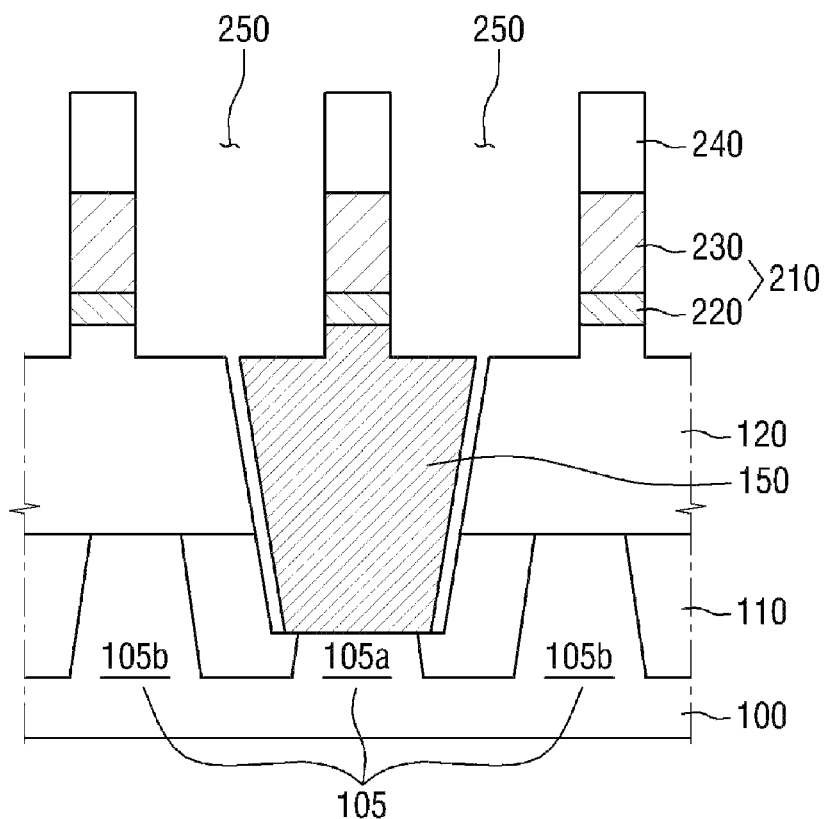

Referring to FIGS. 2 and 8, the spacer 140 is etched (S700). In detail, after the top surface of the spacer 140 is exposed by the first etching process, only the spacer 140 may be selectively etched.

The spacer 140 may be etched by a second etching process different from the first etching process performed to expose the spacer 140. For example, the first etching process may be a dry etching process and the second etching process may be a wet etching process. If the second etching process is a wet etching process, only the spacer 140 can be selectively etched without causing damage to the substrate 100, the capping layer 120, the bit line contact 150, the bit line 240 and the hard mask 240, that is, without etching the substrate 100, the capping layer 120, the bit line contact 150, the bit line 240 and the hard mask 240. In order to remove only the spacer 140 by wet etching in such a manner, etching selectivity of the spacer 140 should be higher than that of the substrate 100, the capping layer 120, the bit line contact 150, the bit line 240 and the hard mask 240, and it is necessary to use an appropriate etching solution. For example, if only the spacer 140 includes an oxide and the substrate 100, the capping layer 120, the bit line contact 150, the bit line 240 and the hard mask 240 do not include an oxide, only the spacer 140 may be selectively etched using $H_xF_y$ as the etching solution, but example embodiments of the inventive concepts are not limited thereto. If only the spacer 140 can be selectively etched, materials for forming the spacer 140, the substrate 100, the capping layer 120, the bit line contact 150, the bit line 240 and the hard mask 240, the etching solution and etching method may be different from those stated above.

Figure 9:
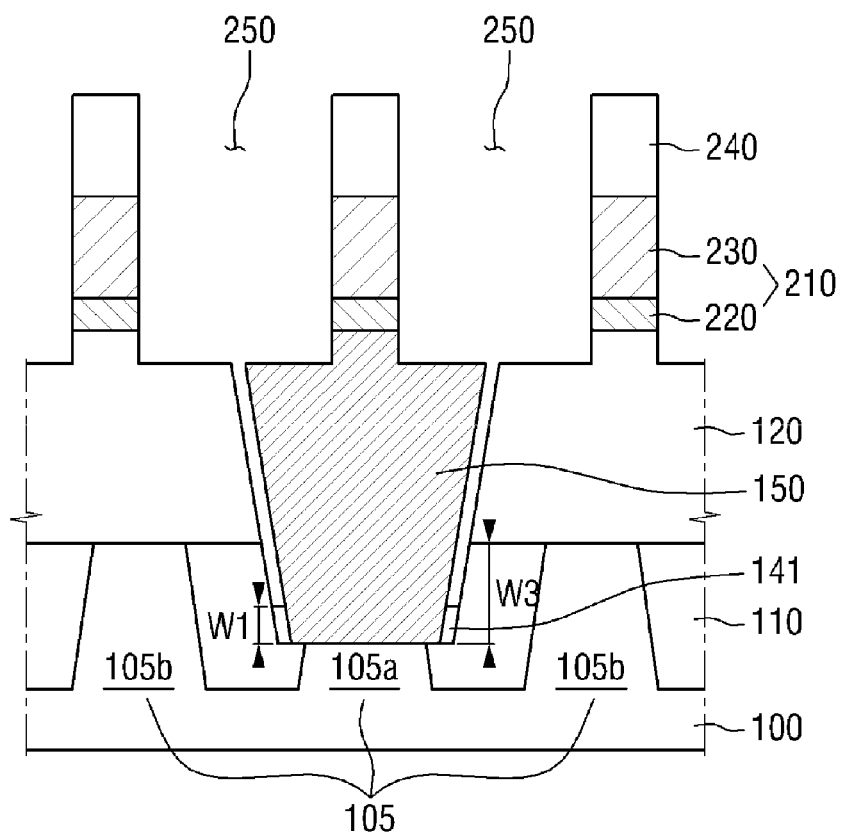

As shown in FIG. 9, the spacer (140 of FIG. 7) may not be completely etched and a partial spacer 141 may remain. Because the etching is performed while only a top portion of the spacer (140 of FIG. 7) is exposed, the partial spacer 141 may remain without being etched according to the width of the spacer (140 of FIG. 7), the processing error, or the height of the spacer (140 of FIG. 7). However, even if the partial spacer 141 remains, only a small portion thereof may remain. For example, a top surface of the partial spacer 141 may be positioned lower than the top surface of the substrate 100. In other words, a length W1 ranging from the top surface of the first active region 105a to the top surface of the partial spacer 141 may be shorter than a length W3 ranging from the top surface of the first active region 105a to a top surface of the second active region 105b.

If the spacer (140 of FIG. 7) is etched by a wet etching process, the length W1 of the remaining partial spacer 141 may vary according to the etching time during which the spacer is exposed to an etching solution. As the etching time is increased, the length W1 is shortened. As shown in FIG. 7, the spacer 140 may be completely etched. However, the shorter the etching time, the longer the length W1. If the length W1 is longer than the length ranging from the top surface of the first active region 105a to the top surface of the second active region 105b, securing a margin between the storage node contact and the bit line contact 150 may not be possible.

Therefore, in a case of performing a wet etching process, a sufficient time may be required for the spacer (140 of FIG. 7) to be etched.

Figure 10:
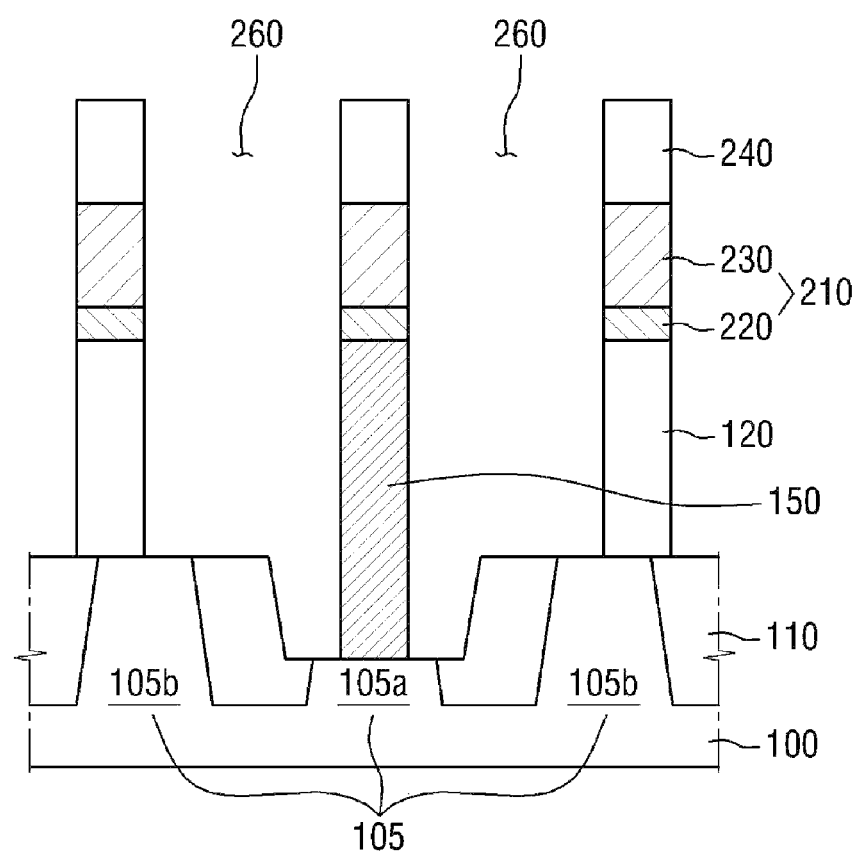

Referring to FIGS. 2 and 10, etching is performed until the active region 105 of the substrate 100 is exposed (S800). The etching process may be the first etching process. The etching used to remove the spacer (140 of FIG. 7) may be the second etching process. Thus, the method for removing the spacer (140 of FIG. 7) and the method for exposing the active region 105 may be different from each other. The etching used to expose the active region 105 of the substrate 100 is the first etching process and the etching used to etch the bit line layer (210a of FIG. 6) to expose the spacer (140 of FIG. 6) is also the first etching process. In other words, the etching used to expose the active region 105 of the substrate 100 and the etching used to etch the bit line layer (210a of FIG. 6) may be the same width each other. As described above, the first etching process may be a dry etching process.

While the etching is performed, the hard mask 240 may function as a mask. A portion where the hard mask 240 is formed may not be etched by the hard mask 240 and only a portion where the hard mask 240 is not formed may be etched. Eventually, a width of the storage node contact hole 260 may be determined according to the shape of the hard mask 240.

If the capping layer 120 is a polysilicon layer and the bit line contact 150 includes polysilicon, that is, if the capping layer 120 and the bit line contact 150 include the same material, when the bit line contact 150 is etched, the capping layer 120 may also be etched. Therefore, as shown in FIG. 10, the first active region 105a and the second active region 105b may be exposed, and a portion of the bit line contact 150, which is not covered by the hard mask 240, may be removed. Accordingly, the capping layer 120, the bit line 210 and the hard mask 240 may have the same width and may be shaped of a straight line. In addition, the bit line contact 150, the bit line 210 and the hard mask 240 may also have the same width and may be shaped of a straight line.

Figure 11:
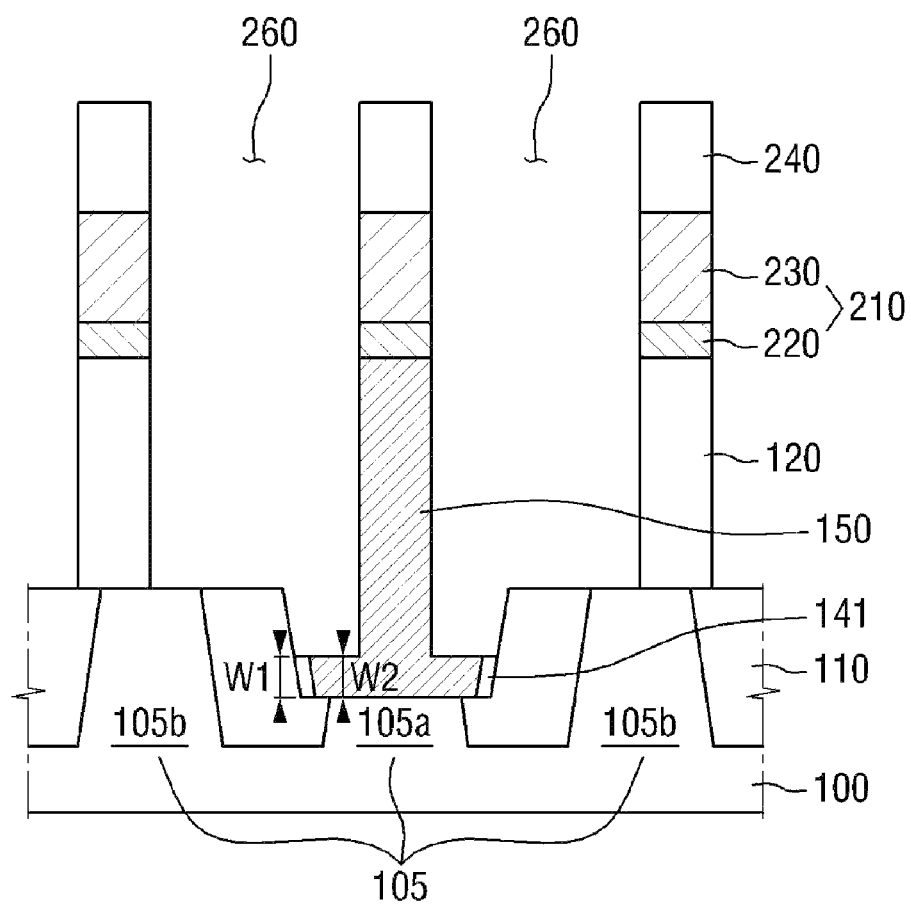
Figure 12:
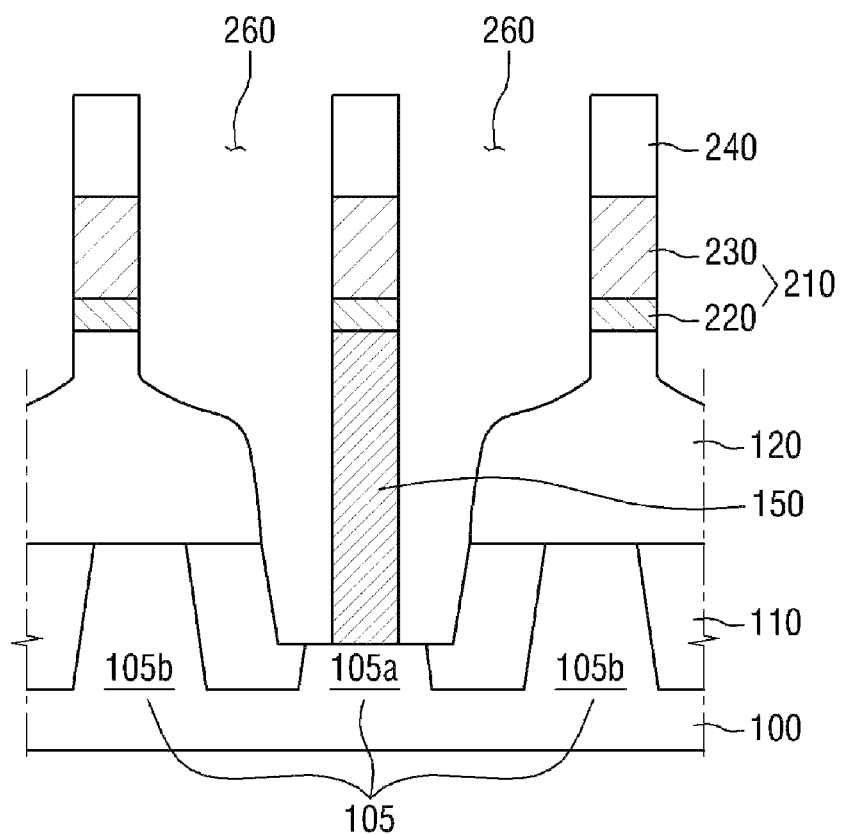

If the partial spacer 141 remains, as shown in FIG. 11, the second active region 105b may be exposed and the first active region 105a may not be exposed. In other words, a portion of the bit line contact 150 may remain by the partial spacer 141 without being etched. In FIG. 11, the length W1 ranging from the top surface of the first active region 105a to the top surface of the partial spacer 141 and a length W2 ranging from the top surface of the first active region 105a to the top surface of the bit line contact 150 are the same, but example embodiments of the inventive concepts are not limited thereto. For example, W2 may be smaller than W1. Meanwhile, if the capping layer 120 is an insulation layer, as shown in FIG. 12, the capping layer 120 may not be etched. The bit line contact 150, excluding a portion of the bit line contact 150 covered by the hard mask 240, is completely removed. However, because the capping layer 120 and the bit line contact 150 are made of different materials, they may not be etched or may only be partially etched. Therefore, the second active region 105b may not be exposed. Even if the second active region 105b is not exposed at this stage, the second active region 105b may later be exposed by gap-filling the storage contact hole 260 and etching the same again in the course of forming a storage node contact (not shown).

Therefore, non-exposure of the second active region 105b at this stage is unproblematic. Rather, the storage node contact may be formed on the second active region 105b so as to make contact with the second active region 105b.

In example embodiments of the inventive concepts, before forming the storage node contact hole 260, the spacer 140 may be selectively etched, thereby securing a sufficient margin between the bit line contact 150 and the storage node contact formed in the storage contact hole 260, and between the bit line 210 and the storage node contact. If the spacer 140 is not removed, the bit line 210 may be misaligned due to a processing error, which is problematic unless the bit line 210 is accurately positioned at the center of the bit line contact 150. If the bit line 210 is formed to be closer to the spacer 140 of one side, a distance between the bit line 210 and the spacer 140 is smaller, so that the bit line contact 150 is not etched.

If the storage node contact is formed in a state in which the bit line contact 150 is not etched, the margin between the storage node contact and the bit line contact 150 is reduced, resulting in interference and possibly generating a short. Therefore, in order to prevent or inhibit a semiconductor device from malfunctioning and to improve the reliability of the semiconductor device, the spacer 140 may be selectively exposed. Even if the bit line 210 is misaligned on the bit line contact 150, a space created by removing the spacer 140 can be increased by selectively removing the spacer 140, thereby securing a sufficient margin between the bit line contact 150 and the storage node contact.

Referring to FIG. 2, the storage node contact is formed in the storage node contact hole (S900). In forming the storage node contact, the storage node contact is formed (not shown) by gap-filling the storage node contact hole 260 and etching the resultant product to expose a second active region 105b in the storage node contact hole 260. However, the inventive concepts do not limit the method for forming the storage node contact to that illustrated herein. Other methods for forming the storage node contact can be easily inferred by one skilled in the art, and detailed descriptions thereof will be omitted.

A method for fabricating a semiconductor device according to example embodiments of the inventive concepts will be described with reference to FIGS. 2 and 13 to 15.

Figure 13:
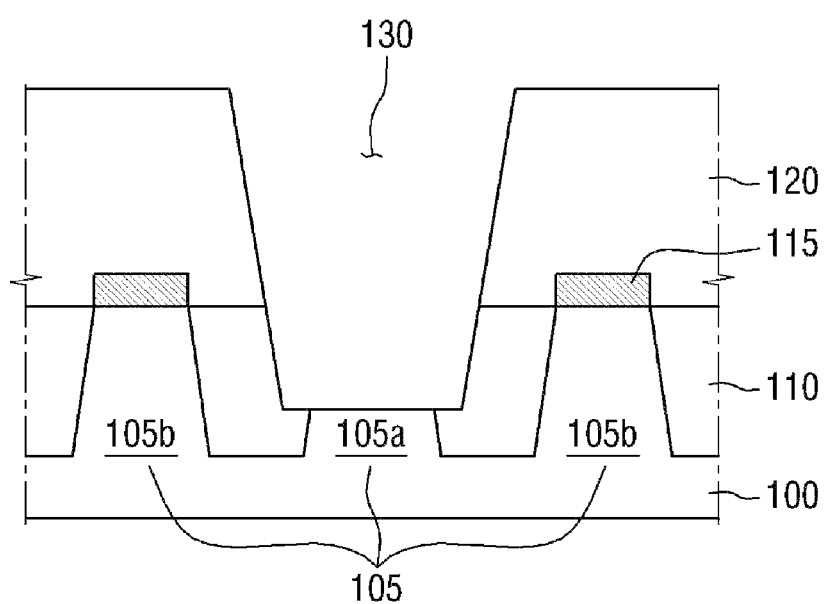
FIGS. 13 to 15 are cross-sectional views taken along the line A-A' of FIG. 1, illustrating intermediate process steps of a method for fabricating a semiconductor device according to example embodiments of the inventive concepts.
Figure 14:
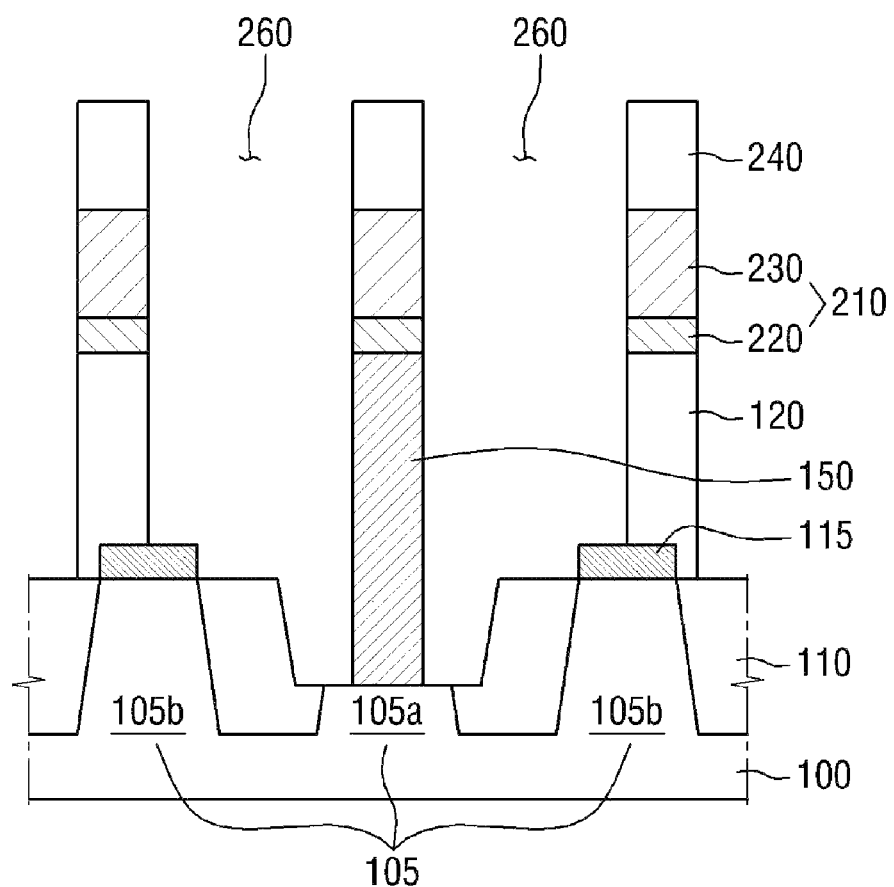
Figure 15:
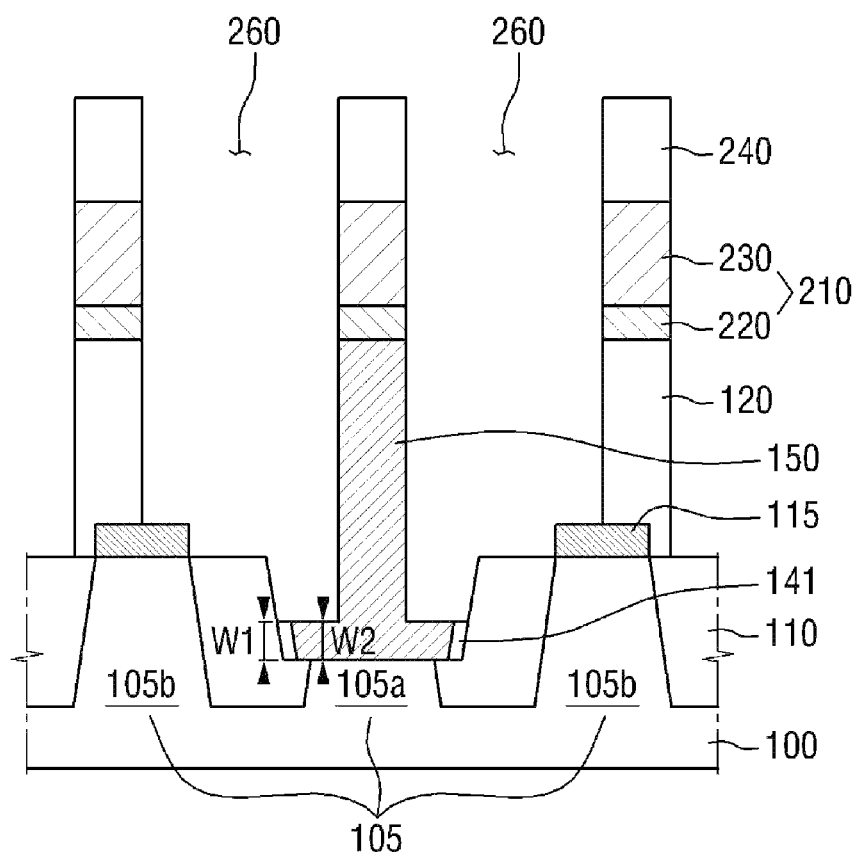

FIGS. 13 to 15 are cross-sectional views taken along the line A-A' of FIG. 1, illustrating intermediate process steps of a method for fabricating a semiconductor device according to example embodiments of the inventive concepts. In the following description, repeated descriptions of the same or corresponding parts as those of the previous embodiment will be omitted and only differences therebetween will be described herein.

Referring to FIGS. 2 and 13, the capping layer 120 including the bit line contact hole 130 may be formed on the substrate 100 (S100). Referring to FIG. 13, unlike in the previous embodiment, before the capping layer 120 is formed on the substrate 100 (S100 of FIG. 2), a conductive pad 115 may be formed on the second active region 105b. The conductive pad 115 facilitates a connection between a storage node contact to be formed later and the second active region 105b.

The conductive pad 115 may be formed when the capping layer 120 is an insulation layer. Unlike polysilicon, the insulation layer is a nonconducting substance and has relatively low etching selectivity. Thus, etching the insulation layer until the second active region 105b is exposed in a subsequent process may be difficult. Accordingly, contact failure between the storage node contact and the second active region 105b and reduction of interfacial resistance by forming the conductive pad 115 on the second active region 105b may be prevented or inhibited. When the conductive pad 115 is formed, a material for forming the conductive pad 115 may be, for example, polysilicon, but example embodiments of the inventive concepts are not limited thereto. Any material can be used in forming the conductive pad 115 as long as the material has conductivity and relatively low resistance.

However, as described above, the conductive pad 115 is not formed only when the capping layer 120 is an insulation layer. When the capping layer 120 is a polysilicon layer, the conductive pad 115 may also be formed. In example embodiments, however, the conductive pad 115 may be formed of a different material from the capping layer 120. For example, the conductive pad 115 may be formed of Ti or W.

Referring back to FIGS. 2 and 14, a spacer may be formed in the bit line contact hole (S200). A bit line contact may be formed in the bit line contact hole (S300). A bit line layer may be formed (S400). A hard mask layer may be formed on the bit line layer (S500). The spacer may be exposed (S600). The exposed spacer may be etched (S700). These processes are substantially the same as those of the previous embodiment, except that the conductive pad 115 is formed on the second active region 105b.

Referring back to FIG. 2, etching is performed until the active region 105 of the substrate 100 is exposed (S800). Referring to FIG. 14, when the active region 105 is exposed (S800 of FIG. 2), the conductive pad 115 may also be exposed. When the active region 105 is exposed, the conductive pad 115 may also be exposed because the capping layer 120 is etched together with the bit line contact 150 if the capping layer 120 is a polysilicon layer. If the capping layer 150 is a polysilicon layer, the conductive pad 115 is not etched together with the capping layer 120 because it is formed of a material other than polysilicon, for example, Ti or W.

Referring to FIG. 15, when a partial spacer 141 remains, a portion of the bit line contact 150 is not etched, so that the first active region 105a may not be exposed. As shown in FIG. 11, a length W1 ranging from a top surface of the first active region 105a to a top surface of the partial spacer 141 may be equal to a length W2 ranging from the top surface of the first active region 105a to a top surface of the unetched bit line contact 150. Alternatively, W2 may be smaller than W1.

Although not shown, when the capping layer 120 is an insulation layer, the capping layer 120 is not etched or partially etched, so that the conductive pad 115 may not be exposed (see FIG. 12). In addition, when the capping layer 120 is an insulation layer, the conductive pad 115 may be a polysilicon layer. In example embodiments, the conductive pad 115 includes the same material as the bit line contact 150. Thus, when the bit line contact 150 is etched in a state in which the conductive pad 115 is exposed, the conductive pad 115 may also be etched. However, because the capping layer 120 covers the conductive pad 115, the conductive pad 115 may not be etched when the bit line contact 150 is etched.

If the capping layer 120 is an insulation layer, the second active region 105b may not be exposed at this stage. However, the conductive pad 115 may be exposed by gap-filling the storage contact hole 260 and etching the resultant product in the course of forming a storage node contact in a later step. Therefore, even if the conductive pad 115 is not exposed at this stage, which is not problematic, the storage node contact may be formed on the conductive pad 115 so as to make contact with the conductive pad 115.

Referring to FIG. 2, the storage node contact is formed (S900). In the forming the storage node contact, the storage node contact (not shown) may be formed on the conductive pad by gap-filling the storage node contact hole and etching the resultant product to expose a second active region in the storage node contact hole. However, the inventive concepts are not limited to the method for forming the storage node contact as illustrated herein. Other methods for forming the storage node contact can be easily inferred by one skilled in the art, and detailed descriptions thereof will be omitted.

Figure 16:
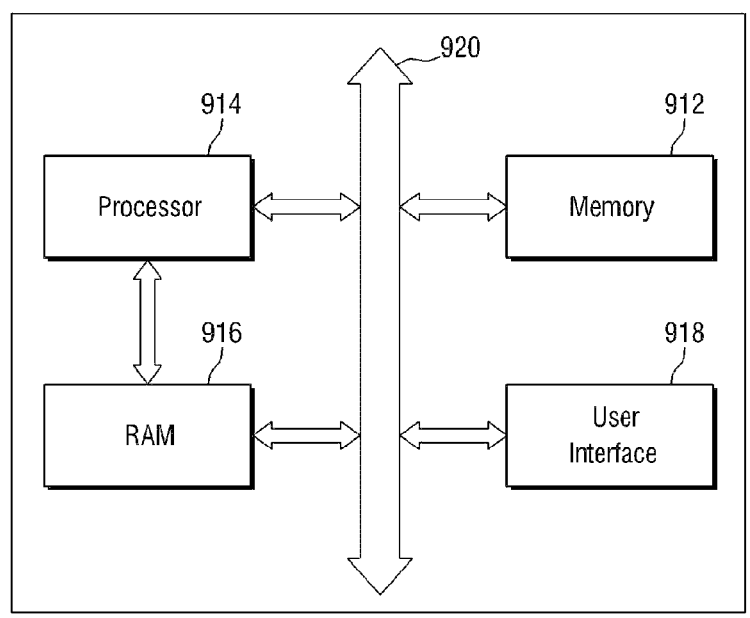
FIG. 16 is a block diagram of an electronic system including semiconductor devices according to example embodiments of the inventive concepts.
Figure 17:
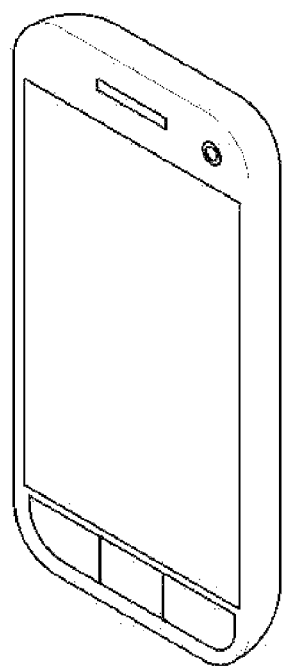
FIGS. 17 to 19 illustrate an example electronic system to which semiconductor devices according to example embodiments of the inventive concepts can be employed.
Figure 18:
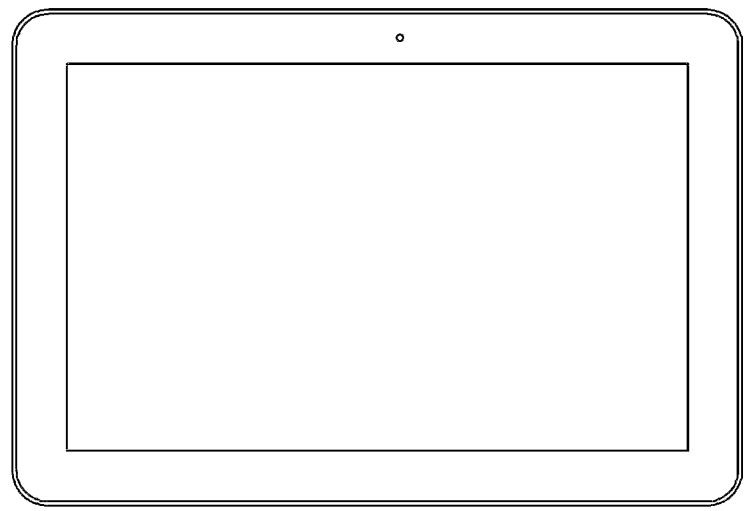
Figure 19:
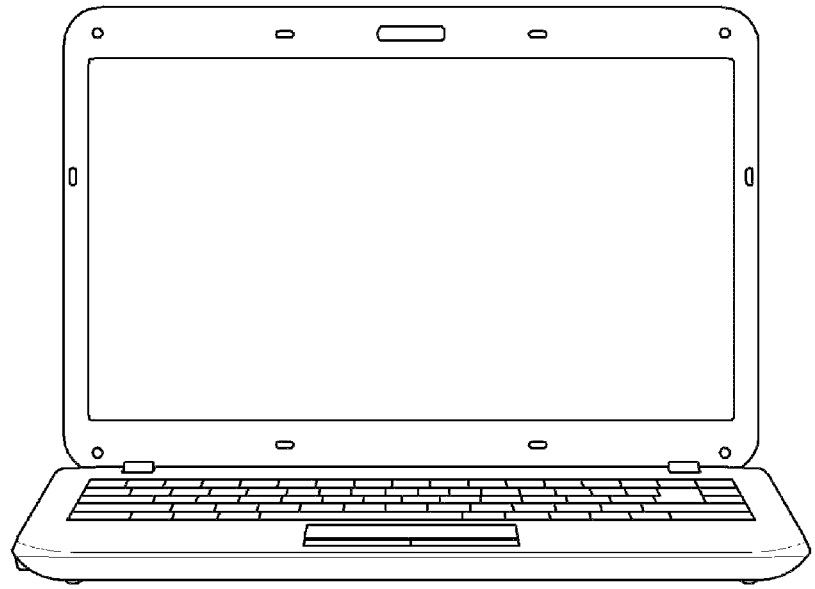

FIG. 16 is a block diagram of an electronic system including semiconductor devices according to example embodiments of the inventive concepts, and FIGS. 17 to 19 illustrate an example electronic system to which semiconductor devices according to example embodiments of the inventive concepts can be employed.

Referring to FIG. 16, the electronic system 900 may include at least one semiconductor device according to example embodiments of the inventive concepts. The electronic system 900 may include a mobile device or a computer. For example, the electronic system 900 may include a memory system 912, a processor 914, a RAM 916, and a user interface 918.

The memory system 912, the processor 914, the RAM 916 and the user interface 918 may perform data communication with each other through a bus 920. The processor 914 may execute a program and may control the electronic system 900. The RAM 916 may be used as an operating memory of the processor 914. For example, each of the processor 914 and the RAM 916 may include semiconductor devices according to example embodiments of the inventive concepts. The user interface 918 may be used to input/output data to/from the electronic system 900. The memory system 912 may store codes for the operation of the processor 914, data processed by the processor 914 or externally input data. The memory system 912 may include a controller and a memory.

The electronic system 900 may be applied to electronic control devices of a variety of electronic devices. Meanwhile, FIG. 17 illustrates an example in which an electronic system (900 of FIG. 16) is applied to a smart phone (1000), FIG. 18 illustrates an example in which an electronic system (900 of FIG. 16) is applied to a tablet PC, and FIG. 19 illustrates an example in which an electronic system 900 is applied to a notebook computer.

In example embodiments, the memory system (900 of FIG. 16) may also be applied to a personal computer (PC), a navigation device, a solid state disk (SSD), an automobile, household appliances, etc. One skilled in the art of semiconductor devices would appreciate that the semiconductor device according to example embodiments of the inventive concepts may also be applied to other IC devices not illustrated herein.

While the inventive concepts have been particularly shown and described with reference to example embodiments thereof, it will be understood by those of ordinary skill in the art that various changes in form and details may be made therein without departing from the spirit and scope of the present inventive concepts as defined by the following claims. It is therefore desired that example embodiments be considered in all respects as illustrative and not restrictive, reference being made to the appended claims rather than the foregoing description to indicate the scope of the inventive concepts.

What is claimed is:

1. A method for fabricating a semiconductor device, the method comprising:
   forming a capping layer on a substrate, the capping layer including a bit line contact hole;
   forming a spacer on inner walls of the bit line contact hole;
   forming a bit line contact in the bit line contact hole;
   forming a bit line layer on the substrate;
   exposing the spacer by etching the bit line layer; and
   etching the spacer,
   wherein the forming a capping layer and the forming a bit line contact includes forming the capping layer and the bit line contact of a same material, and
   wherein the forming a capping layer includes forming a polysilicon layer.

2. The method of claim 1, wherein the etching the spacer includes selectively etching the spacer having a different etching selectivity from the substrate, the capping layer, the bit line contact and the bit line layer.

3. The method of claim 2, wherein the exposing the spacer includes performing a first etching process on the bit line layer.

4. The method of claim 3, wherein the etching the spacer includes performing a second etching process on the spacer, the second etching process different from the first etching process.

5. The method of claim 4, wherein the second etching process is a wet etching process.

6. The method of claim 2, wherein the forming a spacer includes forming a material including an oxide.

7. The method of claim 1, wherein the forming a capping layer includes forming an insulation layer.

8. The method of claim 7, before the forming an insulation layer, further comprising:
   forming a conductive pad on an active region of the substrate.

9. The method of claim 1, wherein the forming a bit line layer on the substrate further comprises forming a hard mask layer on the bit line layer.

10. The method of claim 9, after the etching the spacer, further comprising:
    exposing the substrate by etching the bit line contact and the capping layer using the hard mask layer.

11. The method of claim 10, wherein the exposing the substrate includes exposing an active region of the substrate.

* * * * *